(12) United States Patent
Kuroyanagi et al.

(10) Patent No.: US 10,886,891 B2
(45) Date of Patent: Jan. 5, 2021

(54) ACOUSTIC WAVE DEVICE, MODULE, AND MULTIPLEXER

(71) Applicant: TAIYO YUDEN CO., LTD., Tokyo (JP)

(72) Inventors: Takuma Kuroyanagi, Tokyo (JP); Mitsuhiro Habuta, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 24 days.

(21) Appl. No.: 16/269,240

(22) Filed: Feb. 6, 2019

(65) Prior Publication Data

US 2019/0280670 A1  Sep. 12, 2019

(30) Foreign Application Priority Data

Mar. 12, 2018 (JP) .................. 2018-044635

(51) Int. Cl.
*H03H 9/02* (2006.01)
*H03H 9/05* (2006.01)
(Continued)

(52) U.S. Cl.
CPC .... *H03H 9/02834* (2013.01); *H03H 9/02102* (2013.01); *H03H 9/02559* (2013.01);
(Continued)

(58) Field of Classification Search
CPC .......... H03H 9/6406; H03H 9/54; H03H 9/25; H03H 9/02559; H03H 9/02834; H03H 9/02102; H03H 9/1007; H03H 9/1064; H03H 9/059; H03H 9/0523; H03H 9/6483; H03H 9/568; H03H 9/605
(Continued)

(56) References Cited

U.S. PATENT DOCUMENTS 6,310,422 B1    10/2001  Satoh et al. ................... 310/313
8,004,370 B2 *   8/2011  Yamagata .......... H03H 9/02944
                                                        310/313 D
(Continued)

FOREIGN PATENT DOCUMENTS

| JP | 2005-223580 A | 8/2005 |
| JP | 2008-252351 A | 10/2008 |
| JP | 2011-151638 A | 8/2011 |
| JP | 2017-157922 A | 9/2017 |
| WO | WO 2016/068096 A1 | 5/2016 |
| WO | WO 2016/208287 A1 | 12/2016 |

*Primary Examiner* — Robert J Pascal
*Assistant Examiner* — Jorge L Salazar, Jr.
(74) *Attorney, Agent, or Firm* — Stein IP, LLC

(57) ABSTRACT

An acoustic wave device includes: first and second terminals located on a first surface of a first substrate; a third terminal that is located on the first surface and is a ground terminal; series resonators located on a second surface of the first substrate and electrically connected in series with a path between the first and second terminals; a parallel resonator that is located on the second surface and has a first end electrically connected to the path and a second end electrically connected to the third terminal; and a fourth terminal located on the first surface, at least a part of the fourth terminal overlapping with, in a thickness direction of the first substrate, at least one of one or more first series resonators of the series resonators, the one or more first series resonators having both ends to which other series resonators are electrically connected.

11 Claims, 13 Drawing Sheets

(51) Int. Cl.
  *H03H 9/64*  (2006.01)
  *H03H 9/54*  (2006.01)
  *H03H 9/25*  (2006.01)
  *H03H 9/10*  (2006.01)
  *H03H 9/56*  (2006.01)
  *H03H 9/60*  (2006.01)

(52) U.S. Cl.
  CPC .......... *H03H 9/059* (2013.01); *H03H 9/0523* (2013.01); *H03H 9/1007* (2013.01); *H03H 9/1064* (2013.01); *H03H 9/25* (2013.01); *H03H 9/54* (2013.01); *H03H 9/568* (2013.01); *H03H 9/605* (2013.01); *H03H 9/6406* (2013.01); *H03H 9/6483* (2013.01)

(58) Field of Classification Search
  USPC .......................... 333/133, 187, 188, 193–196
  See application file for complete search history.

(56) References Cited

U.S. PATENT DOCUMENTS

| | | |
|---|---|---|
| 2017/0214386 A1 | 7/2017 | Kido |
| 2017/0250669 A1 | 8/2017 | Kuroyanagi et al. |
| 2018/0013404 A1 | 1/2018 | Kawasaki et al. |

\* cited by examiner

ACOUSTIC WAVE DEVICE, MODULE, AND MULTIPLEXER

CROSS-REFERENCE TO RELATED APPLICATION

This application is based upon and claims the benefit of priority of the prior Japanese Patent Application No. 2018-044635, filed on Mar. 12, 2018, the entire contents of which are incorporated herein by reference.

FIELD

A certain aspect of the present invention relates to an acoustic wave device, a module, and a multiplexer.

BACKGROUND

There have been known ladder-type filters including acoustic wave resonators. It has been known to form an acoustic wave resonator on the upper surface of a substrate and form, on the lower surface of the substrate, a terminal electrically connected to the acoustic wave resonator as disclosed in, for example, Japanese Patent Application Publication No. 2017-157922 and International Publication No. 2016/068096.

SUMMARY OF THE INVENTION

According to a first aspect of the present invention, there is provided an acoustic wave device including: a first substrate; a first terminal located on a first surface of the first substrate; a second terminal located on the first surface of the first substrate; a third terminal located on the first surface of the first substrate, the third terminal being a ground terminal; series resonators located on a second surface of the first substrate opposite from the first surface and electrically connected in series with a path between the first terminal and the second terminal; a parallel resonator located on the second surface of the first substrate, a first end of the parallel resonator being electrically connected to the path, a second end of the parallel resonator being electrically connected to the third terminal; and a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected.

According to a second aspect of the present invention, there is provided a module including: the above acoustic wave device; and a module substrate that has a third surface facing the first surface and a fourth surface opposite from the third surface, and includes a fifth terminal located on the third surface and bonded with the fourth terminal, a sixth terminal located on the fourth surface for connecting to an external device, and a metal pattern connecting the fifth terminal and the sixth terminal.

According to a third aspect of the present invention, there is provided a multiplexer including a first filter including the series resonators and the parallel resonator of the above acoustic wave device.

DETAILED DESCRIPTION

Heat generated in the ladder-type filter formed on the substrate is dissipated through heat dissipating paths such as bumps and/or through vias penetrating through the substrate. However, such heat dissipating paths are long, and have not sufficient heat capacities. Thus, the head dissipation performance is poor.

Hereinafter, a description will be given of embodiments of the present disclosure with reference to the accompanying drawings.

First Embodiment

Figure 1:
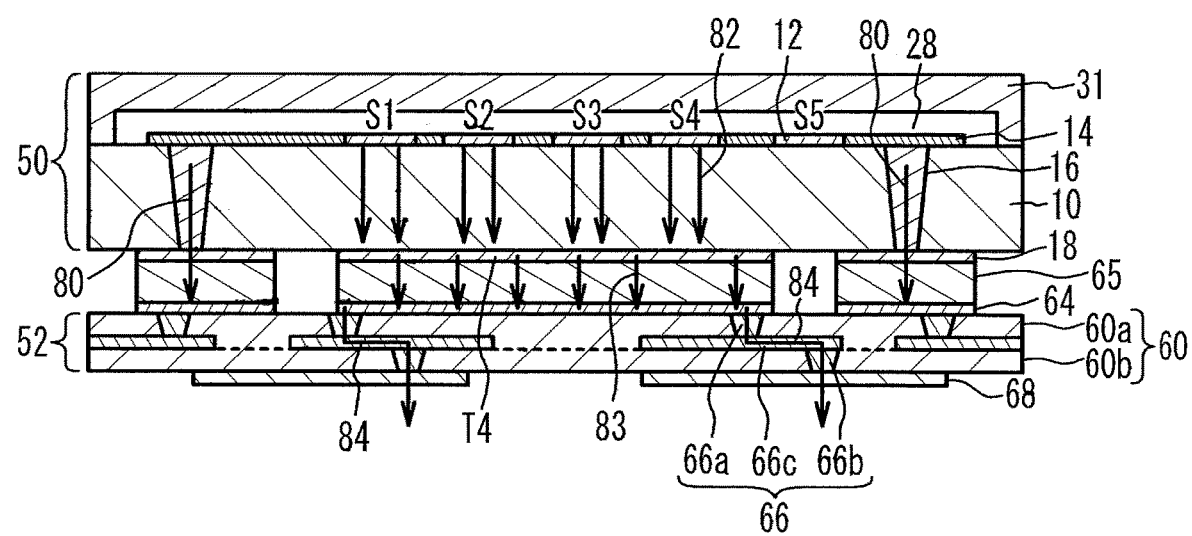
FIG. 1 is a cross-sectional view of an acoustic wave device in accordance with a first embodiment mounted on a module substrate.

FIG. 1 is a cross-sectional view of an acoustic wave device in accordance with a first embodiment mounted on a module substrate. As illustrated in FIG. 1, an acoustic wave device 50 is mounted on a module substrate 52. The acoustic wave device 50 mainly includes a substrate 10 and a sealing portion 31. Acoustic wave resonators 12 and wiring lines 14 are located on the upper surface (a second surface opposite from a first surface) of the substrate 10. Terminals 18 are located on the lower surface (the first surface) of the substrate 10. Through electrodes 16 penetrating through the substrate 10 are provided. The through electrode 16 electrically connects the wiring line 14 and the terminal 18. The wiring lines 14, the through electrodes 16, and the terminals 18 are formed of metal layers made of, for example, copper, gold, aluminum, or nickel. The substrate 10 has a thickness of, for example, 50 µm to 200 µm. The sealing portion 31 is located on the substrate 10, and seals the acoustic wave resonators 12 in an air gap 28. The sealing portion 31 is formed of, for example, a metal, an insulating material such as resin, a piezoelectric substance such as lithium tantalate substrate or lithium niobate, or a semiconductor such as silicon.

The module substrate 52 includes a substrate 60. The substrate 60 includes one or more insulating layers 60a and 60b that are stacked. Terminals 64 are located on the upper surface of the substrate 60. Terminals 68 are located on the lower surface of the substrate 60. The terminal 68 is an external terminal for electrically and thermally connecting to an external device. Through electrodes 66a and 66b respectively penetrating through the insulating layers 60a and 60b are provided, and wiring lines 66c are located between the insulating layers 60a and 60b. The through electrodes 66a and 66b and the wiring line 66c form an internal wiring line 66. The internal wiring line 66 electrically and thermally connects the terminals 64 and 68. The terminals 64 and 18 are bonded with solder 65. Accordingly, the terminals 18 and 64 are electrically and thermally interconnected. The solder 65 has a thickness of, for example, 10 μm to 100 μm. The insulating layers 60a and 60b are, for example, resin layers or ceramic layers. The wiring lines 14, the terminals 18, and the internal wiring lines 66 are formed of metal layers made of, for example, copper, gold, aluminum, or nickel. The solder 65 is, for example, a tin silver alloy or tin silver copper alloy.

Figure 2:
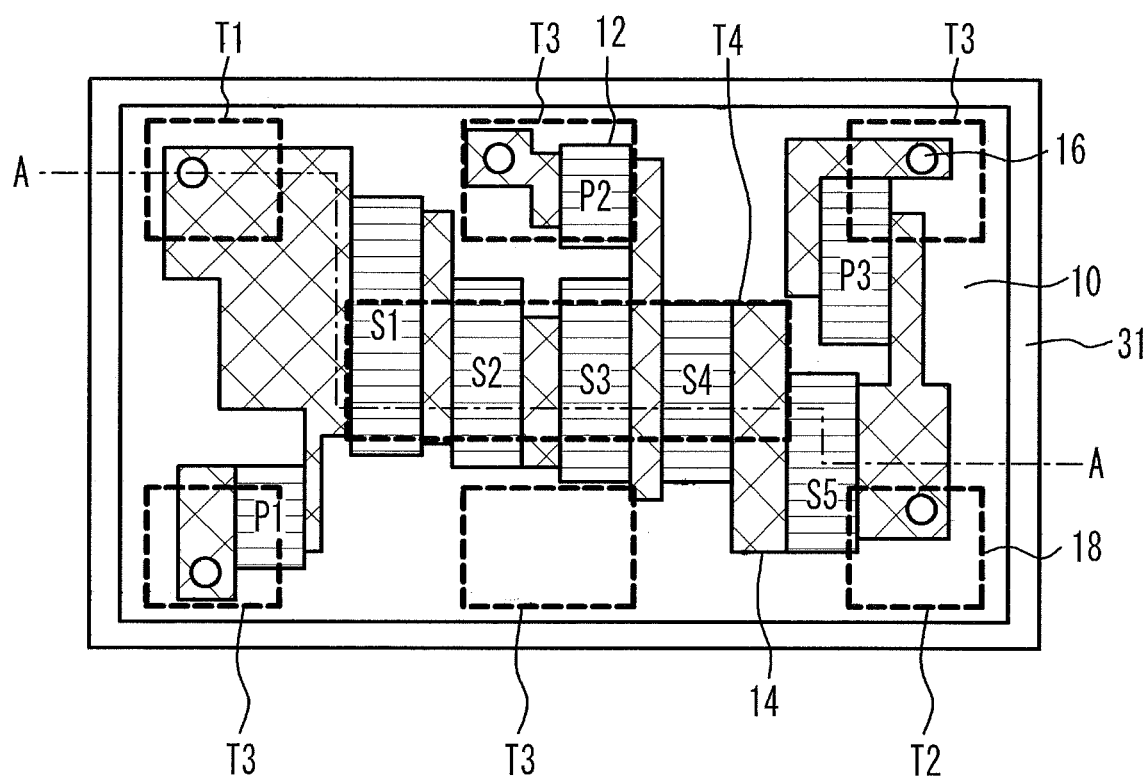
FIG. 2 is a plan view of the acoustic wave device of the first embodiment.

FIG. 2 is a plan view of the acoustic wave device of the first embodiment. FIG. 2 illustrates the acoustic wave resonators 12, the wiring lines 14, the through electrodes 16, and the terminals 18. FIG. 1 corresponds to a cross-sectional view taken along line A-A in FIG. 2. As illustrated in FIG. 2, the acoustic wave resonators 12 are located on the upper surface of the substrate 10. The acoustic wave resonators 12 include series resonators S1 through S5 and parallel resonators P1 through P3. The wiring lines 14 electrically connect between the acoustic wave resonators 12, and electrically connect the acoustic wave resonators 12 and the through electrodes 16. The terminals 18 include terminals T1 through T4.

Figure 3:
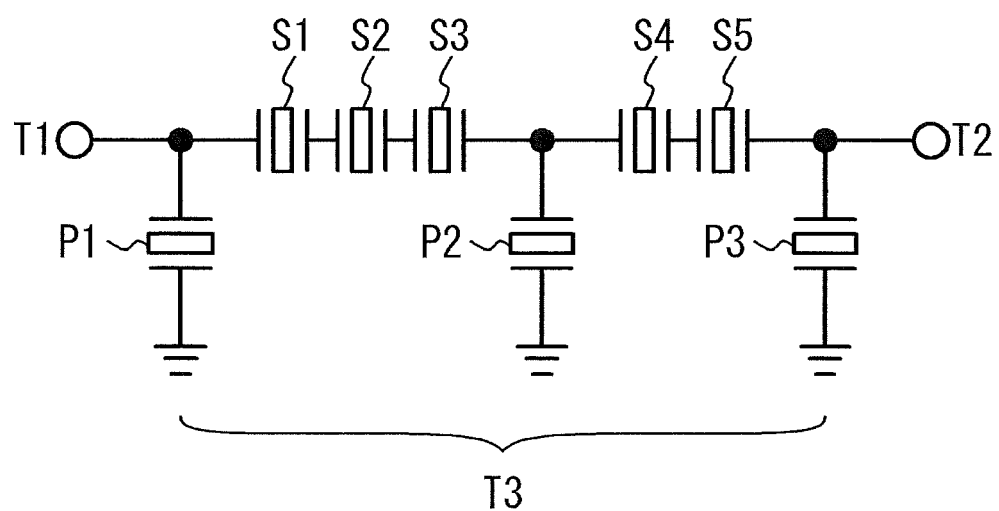
FIG. 3 is a circuit diagram of the acoustic wave device in the first embodiment.

FIG. 3 is a circuit diagram of the acoustic wave device in the first embodiment. In FIG. 2 and FIG. 3, the series resonators S1 through S5 are electrically connected in series with a series path between the terminals T1 and T2. First ends of the parallel resonators P1 through P3 are connected to the series path between the terminals T1 and T2, and second ends of the parallel resonators P1 through P3 are connected to the terminals T3. The terminal T1 (a first terminal) is an input terminal to which high-frequency signals are input, the terminal T2 (a second terminal) is an output terminal from which high-frequency signals are output, and the terminal T3 (a third terminal) is a ground terminal to which a ground potential is supplied. The terminal T4 (a fourth terminal) is located so as to overlap with the series resonators S1 through S4 in the thickness direction of the substrate 10. The terminals T1 through T4 are individually coupled to the terminals 64 through the solder 65 as illustrated in FIG. 1. The number of the series resonators and the number of the parallel resonators can be freely selected.

Figure 4A:
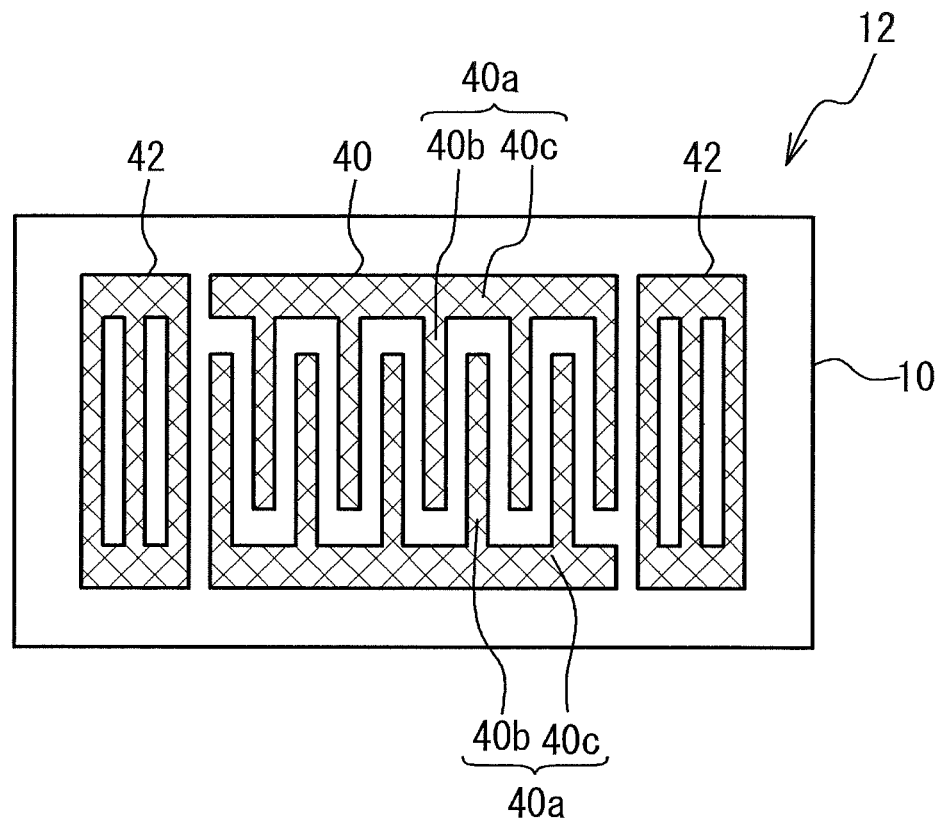
FIG. 4A is a plan view of an acoustic wave resonator in the first embodiment.
Figure 4B:
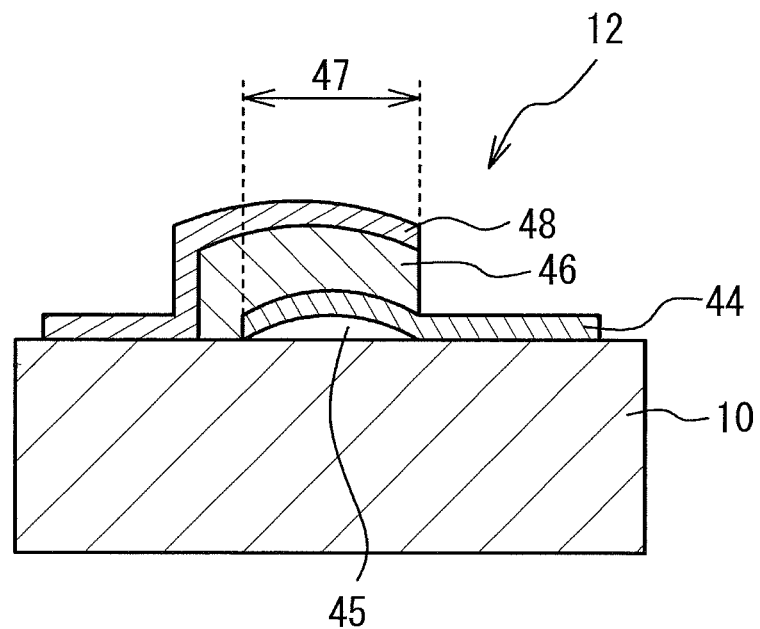
FIG. 4B is a cross-sectional view of another acoustic wave resonator in the first embodiment.

FIG. 4A is a plan view of an acoustic wave resonator in the first embodiment, and FIG. 4B is a cross-sectional view of another acoustic wave resonator in the first embodiment. In the example of FIG. 4A, the acoustic wave resonator 12 is a surface acoustic wave resonator. An Interdigital Transducer (IDT) 40 and reflectors 42 are located on the upper surface of the substrate 10. The IDT 40 includes a pair of comb-shaped electrodes 40a facing each other. The comb-shaped electrode 40a includes electrode fingers 40b and a bus bar 40c connecting the electrode fingers 40b. The reflectors 42 are located at both sides of the IDT 40. The IDT 40 excites a surface acoustic wave on the substrate 10. The substrate 10 is, for example, a piezoelectric substrate such as a lithium tantalate substrate, a lithium niobate substrate, or a crystal substrate. The substrate 10 may be a composite substrate having a structure in which a piezoelectric substrate is bonded on a support substrate such as, for example, a sapphire substrate, a spinel substrate, an alumina substrate, a crystal substrate, or a silicon substrate. The IDT 40 and the reflectors 42 are formed of, for example, an aluminum film or a copper film. A protective film or a temperature compensation film may be located on the substrate 10 so as to cover the IDT 40 and the reflectors 42.

In the example of FIG. 4B, the acoustic wave resonator 12 is a piezoelectric thin film resonator. A piezoelectric film 46 is located on the substrate 10. A lower electrode 44 and an upper electrode 48 are provided so as to sandwich the piezoelectric film 46. An air gap 45 is formed between the lower electrode 44 and the substrate 10. The region where the lower electrode 44 and the upper electrode 48 face each other across at least a part of the piezoelectric film 46 is a resonance region 47. The lower electrode 44 and the upper electrode 48 in the resonance region 47 excite the acoustic wave in the thickness extension mode in the piezoelectric film 46. The substrate 10 is, for example, a sapphire substrate, a spinel substrate, an alumina substrate, a glass substrate, a crystal substrate, or a silicon substrate. The lower electrode 44 and the upper electrode 48 are formed of metal films such as, for example, ruthenium films. The piezoelectric film 46 is, for example, an aluminum nitride film. The acoustic wave resonator 12 includes the electrode that excites the acoustic wave. Thus, the acoustic wave resonator 12 is covered with the air gap 28 so as not to restrict the excitation of the acoustic wave.

First Variation of the First Embodiment

Figure 5:
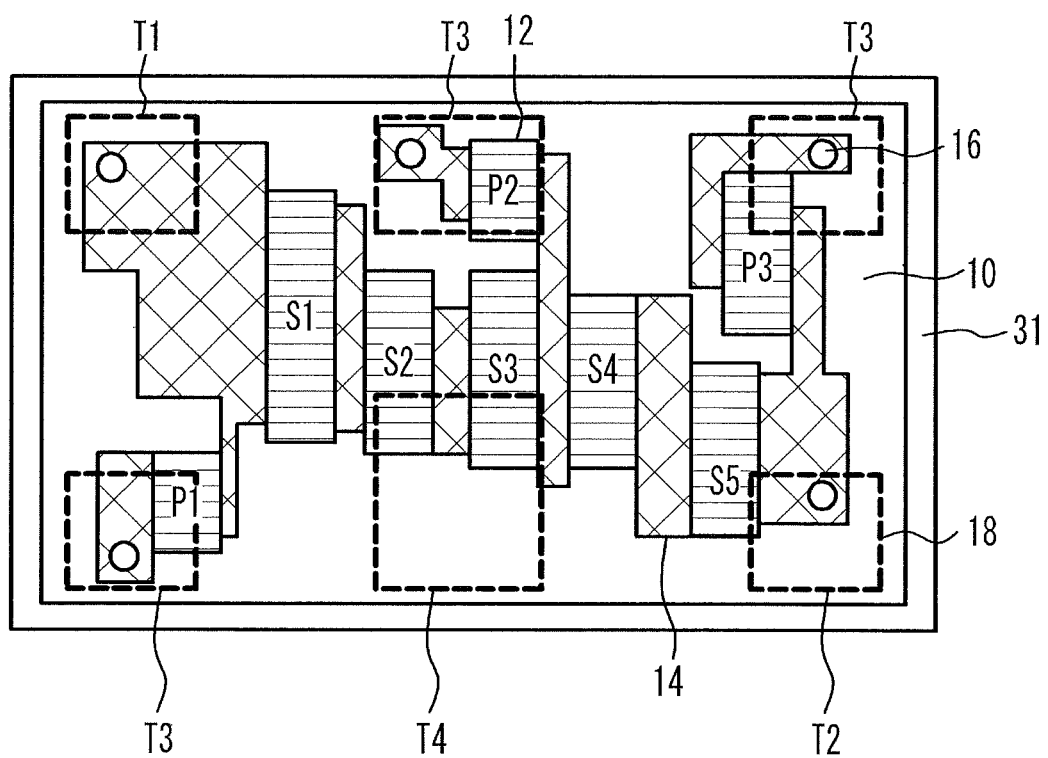
FIG. 5 is a plan view of an acoustic wave device in accordance with a first variation of the first embodiment.

FIG. 5 is a plan view of an acoustic wave device in accordance with a first variation of the first embodiment. As illustrated in FIG. 5, the terminal T4 overlaps with a part of each of the series resonators S2 and S3, and do not overlap with other resonators. Other structures are the same as those of the first embodiment, and the description thereof is thus omitted.

Second Variation of the First Embodiment

Figure 6:
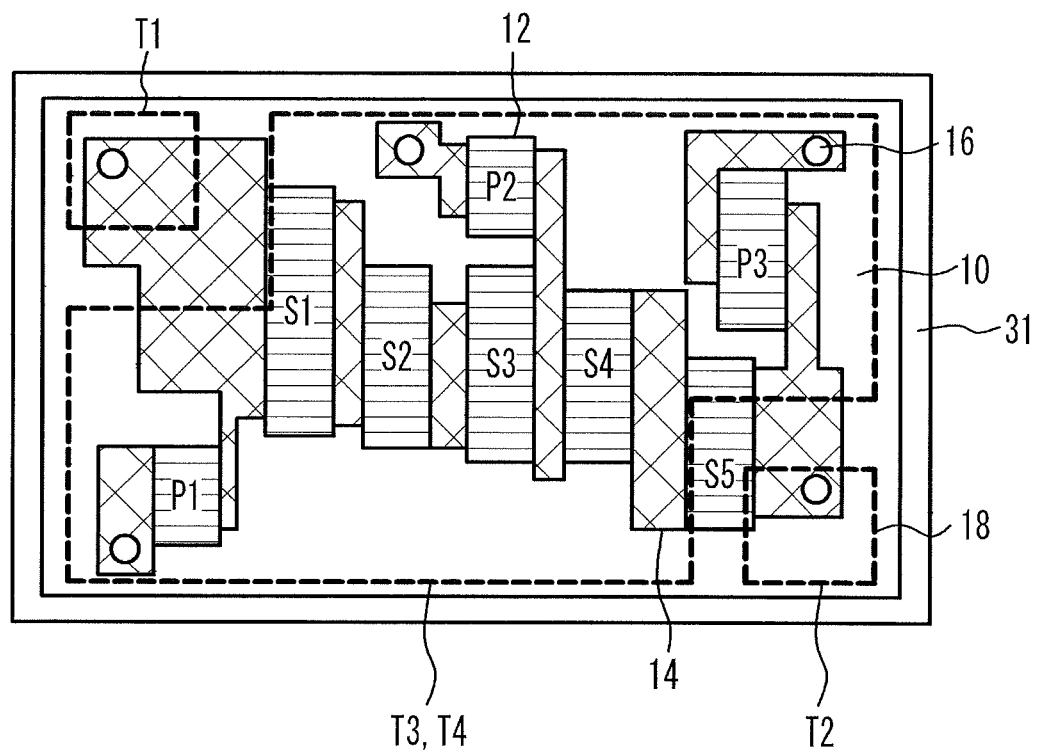
FIG. 6 is a plan view of an acoustic wave device in accordance with a second variation of the first embodiment.

FIG. 6 is a plan view of an acoustic wave device in accordance with a second variation of the first embodiment. As illustrated in FIG. 6, the terminal T4 overlaps with the series resonators S1 through S4 and the parallel resonators P1 through P3 so that the series resonators S1 through S4 and the parallel resonators P1 through P3 are included within the terminal T4, and overlaps with a part of the series resonator S5. The terminal T4 is coupled to the terminal T3 on the lower surface of the substrate 10. Other structures are the same as those of the first embodiment, and the description thereof is thus omitted.

First Comparative Example

Figure 7:
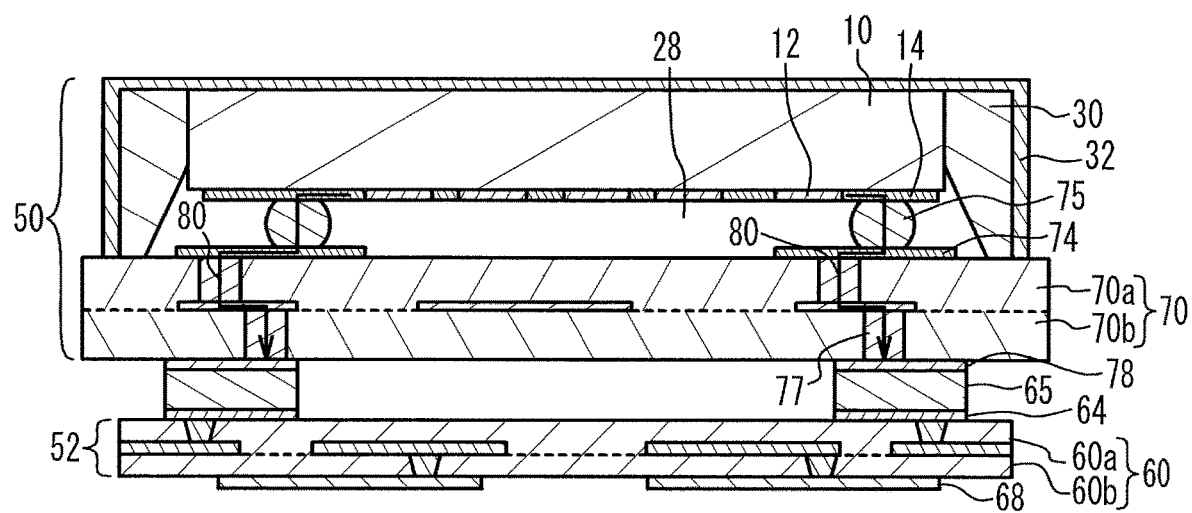
FIG. 7 is a cross-sectional view of an acoustic wave device in accordance with a first comparative example mounted on a module substrate.

FIG. 7 is a cross-sectional view of an acoustic wave device in accordance with a first comparative example mounted on a module substrate. As illustrated in FIG. 7, in the acoustic wave device 50, the substrate 10 is mounted on a substrate 70. The substrate 70 includes insulating layers 70a and 70b that are stacked. Terminals 74 are located on the upper surface of the substrate 70, and terminals 78 are located on the lower surface of the substrate 70. The terminals 74 and 78 are connected by an internal wiring line 77. The substrate 10 is flip-chip mounted on the substrate 70 through bumps 75. A sealing portion 30 is provided so as to surround the substrate 10. A protective film 32 is provided so as to cover the sealing portion 30 and the upper surface of the substrate 10.

In the first comparative example, heat generated in the acoustic wave resonator 12 located on the substrate 10 mainly passes through the wiring line 14, the bump 75, the terminal 74, the internal wiring line 77, and the terminal 78 as a heat dissipating path 80, and reaches the substrate 60. The heat dissipating path 80 is long and has a small heat capacity. For example, the heat dissipating path 80 passes through the bump 75 having a small cross-sectional area. Thus, the heat dissipation performance is poor. Therefore, the acoustic wave device has low power durability.

In contrast, as illustrated in FIG. 1, in the first embodiment, in addition to the heat dissipating path 80 passing through the wiring line 14, the through electrode 16, and the terminal 18, heat dissipating paths 82 from the series resonators S1 through S4 to the terminal T4 through the substrate 10 are formed. Furthermore, heat is dissipated to the outside through a dissipating path 83, which passes through the terminal T4, the solder 65, and the terminal 64, and a heat dissipating path 84, which passes through the terminal 64 coupled to the terminal T4, the internal wiring line 66, and the terminal 68. In the ladder-type filter, high-frequency signals input to the terminal T1 mainly pass through the series resonators S1 through S5. Thus, the series resonators S1 through S5 are likely to generate heat. In particular, no through electrode 16 is connected to the series resonators S2 through S4 having both ends to which series resonators are electrically connected. Thus, heat is unlikely to escape in the series resonators S2 and S4, and the series resonators S2 and S4 generate the most heat.

In the first embodiment and the variations thereof, as illustrated in FIG. 2, FIG. 5, and FIG. 6, at least a part of the terminal T4 (a fourth terminal) overlaps with, in the thickness direction of the substrate 10 (a first substrate), at least a part of at least one of the one or more series resonators S2 through S4 (first series resonators) having both ends to which other series resonators are electrically connected among the series resonators S1 through S5. This structure allows heat generated in the series resonators S2 through S4, which generate the most heat, to pass through the heat dissipating path 82, which is the shortest path passing through the substrate 10, to reach the terminal 18. In addition, the cross-sectional area of the heat dissipating path 82 can be increased. Thus, the acoustic wave device having high heat dissipation performance and high power durability is achieved.

When the acoustic wave resonator 12 is the surface acoustic wave resonator illustrated in FIG. 4A, "at least a part of the terminal T4 overlaps with at least a part of at least one of the series resonators S2 through S4" means that at least a part of the terminal T4 overlaps with at least a part of at least one of the IDT 40 and the reflectors 42. When the acoustic wave resonator 12 is the piezoelectric thin film resonator illustrated in FIG. 4B, "at least a part of the terminal T4 overlaps with at least a part of at least one of the series resonators S2 through S4" means that at least a part of the terminal T4 overlaps with at least a part of the resonance region 47.

In the first embodiment and the first variation thereof, as illustrated in FIG. 2 and FIG. 5, the terminal T4 is electrically connected to none of the terminal T1, the terminal T2, and the terminal T3 in the substrate 10. That is, the electric potential of the terminal T4 is a floating potential. Thus, the parasitic capacitance between each of the series resonators S1 through S4 and a ground is small. Thus, the characteristic degradation due to the parasitic capacitance is inhibited.

In the second variation of the first embodiment, as illustrated in FIG. 6, the terminal T4 electrically connects to the terminal T3 on the lower surface of the substrate 10. The terminal T4 may be grounded as described above. This structure increases the area of the terminal T4, and further enhances the heat dissipation performance.

As illustrated in FIG. 6, the terminal T4 overlaps with, in the thickness direction of the substrate 10, at least one series resonator S2 through S4 of the one or more series resonators S2 through S4 so that at least one of the at least one series resonator S2 through S4 is located within the terminal T4. This structure further enhances the heat dissipation performance from the series resonator located within the terminal T4.

As illustrated in FIG. 2, FIG. 5, and FIG. 6, the terminal T4 overlaps with, in the thickness direction of the substrate 10, the series resonators S2 through S4 having both ends to which other series resonators are electrically connected among the series resonators 81 through S5. This structure further enhances the heat dissipation performance from more series resonators.

As illustrated in FIG. 5, the terminal T4 does not overlap with at least one resonator (the series resonator 81) of the series resonators S1 and S5 (a second series resonator) having a first end to which another series resonator is electrically connected and a second end to which no series resonator is electrically connected (i.e., a series resonator having only one end, of both ends, to which another series resonator is electrically connected), and the parallel resonators P1 through P3. This structure decreases the parasitic capacitance of the series resonator S1. Thus, the high-frequency characteristics is improved.

As illustrated in FIG. 1, in the module used for the communication device, the module substrate 52 includes the terminal 64 (a fifth terminal) located on the upper surface (a third surface facing the lower surface of the substrate 10) and bonded with the terminal T4, the terminal 68 (a sixth terminal) located on the lower surface (a fourth surface opposite from the upper surface) for connecting to an external device, and the internal wiring line 66 (a metal pattern) connecting the terminals 64 and 68. Thus, heat is efficiently dissipated from the terminal T4 to the outside through the terminal 64, the internal wiring line 66, and the terminal 68.

Second Embodiment

Figure 8:
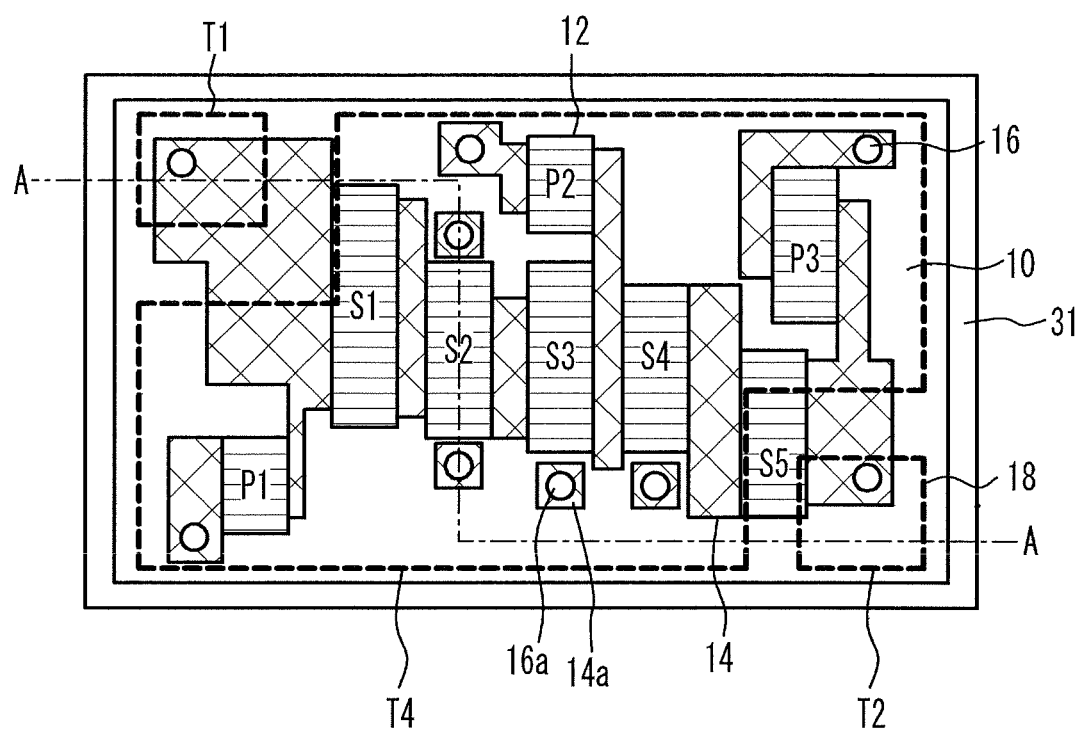
FIG. 8 is a plan view of an acoustic wave device in accordance with a second embodiment.
Figure 9:
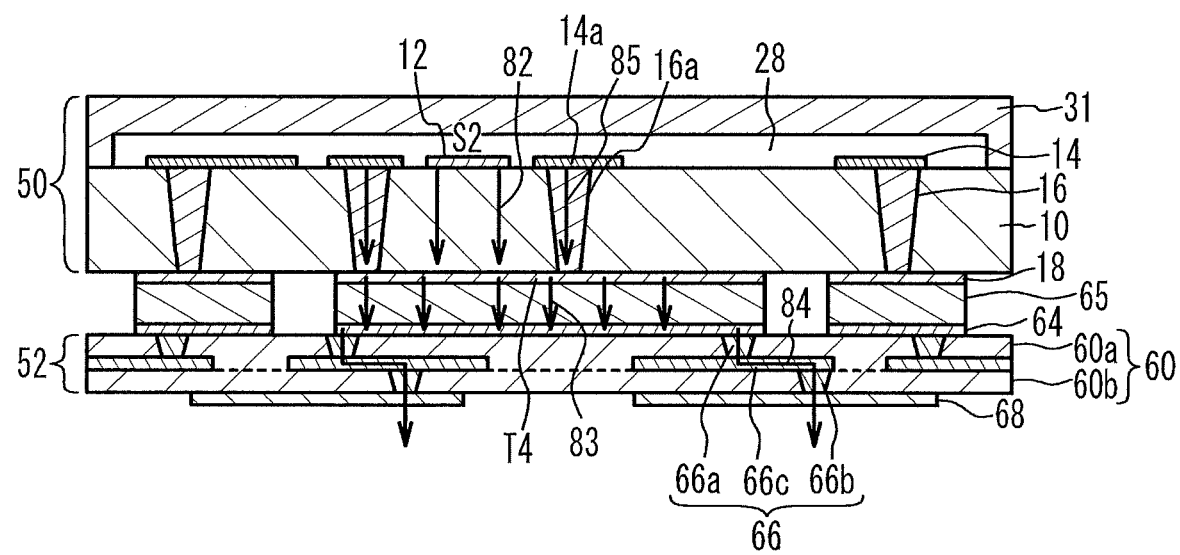
FIG. 9 is a cross-sectional view of the acoustic wave device in accordance with the second embodiment mounted on a module substrate.

FIG. 8 is a plan view of an acoustic wave device in accordance with a second embodiment. FIG. 9 is a cross-sectional view of the acoustic wave device in accordance with the second embodiment mounted on a module substrate. FIG. 9 is a cross-sectional view taken along line A-A in FIG. 8. As illustrated in FIG. 8 and FIG. 9, wiring lines 14a adjacent to the series resonators S2 through S4 are provided. The wiring line 14a is electrically connected to none of the series resonators S2 through S4 on the upper surface of the substrate 10. A through electrode 16a electrically and thermally connects the wiring line 14a and the terminal T4. The thermal conductivity of the through electrode 16a is greater than the thermal conductivity of the substrate 10. No wiring line 14 and no acoustic wave resonator 12 are located between the wiring lines 14a and the through electrodes 16a and the series resonators S2 through S4. Other structures are the same as those of the first embodiment, and the description thereof is thus omitted.

In the second embodiment, the through electrode 16a is adjacent to at least one series resonator of the series resonators S2 through S4. That is, no resonator is located between the through electrode 16a and the series resonator adjacent to the through electrode 16a. Thus, the through electrode 16a is electrically connected to none of the series resonators S1 through S5 and the parallel resonators P1 through P3 on the upper surface of the substrate 10, penetrates through the substrate 10, and is connected to the terminal T4. This structure allows heat to be dissipated from the series resonators S2 through S4 via a heat dissipating path 85 passing through the through electrode 16a in addition to the heat dissipating path 82 as illustrated in FIG. 9. In the variations of the first embodiment, the wiring line 14a and the through electrode 16a may be provided.

First Variation of the Second Embodiment

Figure 10:
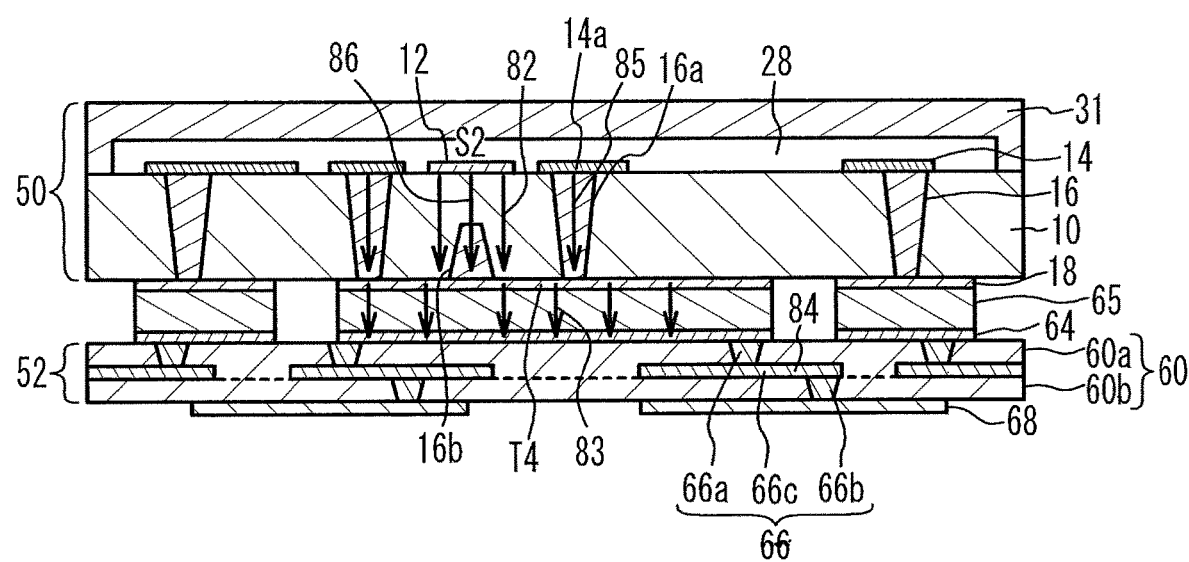
FIG. 10 is a cross-sectional view of an acoustic wave device in accordance with a first variation of the second embodiment mounted on a module substrate.

FIG. 10 is a cross-sectional view of an acoustic wave device in accordance with a first variation of the second embodiment mounted on a module substrate. As illustrated in FIG. 10, a metal column 16b is located from the lower surface of the substrate 10 to the middle part of the substrate 10. The metal column 16b overlaps with the series resonator S2 in the thickness direction of the substrate 10. The metal column 16b is made of the same material as, for example, the through electrodes 16 and 16a. The thermal conductivity of the metal column 16b is greater than the thermal conductivity of the substrate. Other structures are the same as those of the second embodiment, and the description thereof is thus omitted.

In the first variation of the second embodiment, the metal column 16b overlaps with at least one series resonator S2 of the series resonators S2 through S4 in the thickness direction of the substrate 10, is located from the lower surface of the substrate 10 to the middle part of the substrate, and is thermally connected to the terminal T4. Therefore, as indicated as a heat dissipating path 86, heat is efficiently dissipated through the metal column 16b. To efficiently dissipate heat, the height of the metal column 16b is preferably equal to or greater than one-half of the thickness of the substrate 10. The metal column 16b may be provided in the first embodiment and the variations thereof, in which no through electrode 16a is provided.

Third Embodiment

Figure 11:
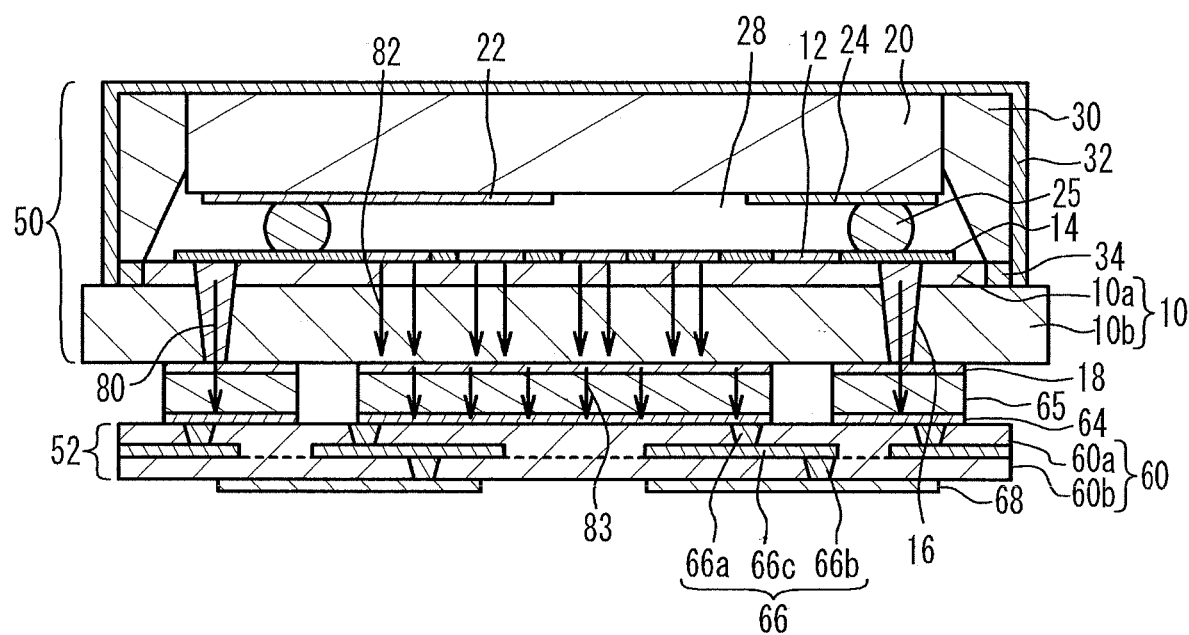
FIG. 11 is a cross-sectional view of an acoustic wave device in accordance with a third embodiment mounted on a module substrate.

FIG. 11 is a cross-sectional view of an acoustic wave device in accordance with a third embodiment mounted on a module substrate. As illustrated in FIG. 11, the substrate 10 is a composite substrate having a structure in which a support substrate 10b and a piezoelectric substrate 10a bonded on the support substrate 10b are stacked. The piezoelectric substrate 10a is directly bonded on the support substrate 10b. A substrate 20 is mounted on the substrate 10 across the air gap 28. Acoustic wave resonators 22 and wiring lines 24 are located on the lower surface of the substrate 20. The acoustic wave resonator 22 is, for example, the surface acoustic wave resonator illustrated in FIG. 4A or the piezoelectric thin film resonator illustrated in FIG. 4B. Bumps 25 are bonded with the wiring lines 14 and 24. The acoustic wave resonator 22 is electrically connected to the terminal 18 through the wiring line 24, the bump 25, the wiring line 14, and the through electrode 16. The wiring line 24 is formed of a metal layer such as, for example, a copper layer, an aluminum layer, or a gold layer. The bump 25 is a metal bump such as, for example, a solder bump, a gold bump, or a copper bump.

In the periphery of the substrate 10, the piezoelectric substrate 10a is removed, and a ring-shaped metal layer 34 is provided. The ring-shaped metal layer 34 is, for example, a copper layer and a nickel layer. The sealing portion 30 is located so as to surround the substrate 20. The sealing portion 30 is bonded with the upper surface of the ring-shaped metal layer 34. The sealing portion 30 seals the acoustic wave resonators 12 and 22 in the air gap 28. The sealing portion 30 is formed of, for example, a metal such as tin silver solder or an insulating material such as resin. The protective film 32 is located so as to cover the upper surface and the side surfaces of the sealing portion 30 and the upper surface of the substrate 20. The protective film 32 is, for example, a metal film such as a nickel film or an insulating film. Other structures are the same as those of the first embodiment, and the description thereof is thus omitted.

First Variation of the Third Embodiment

Figure 12:
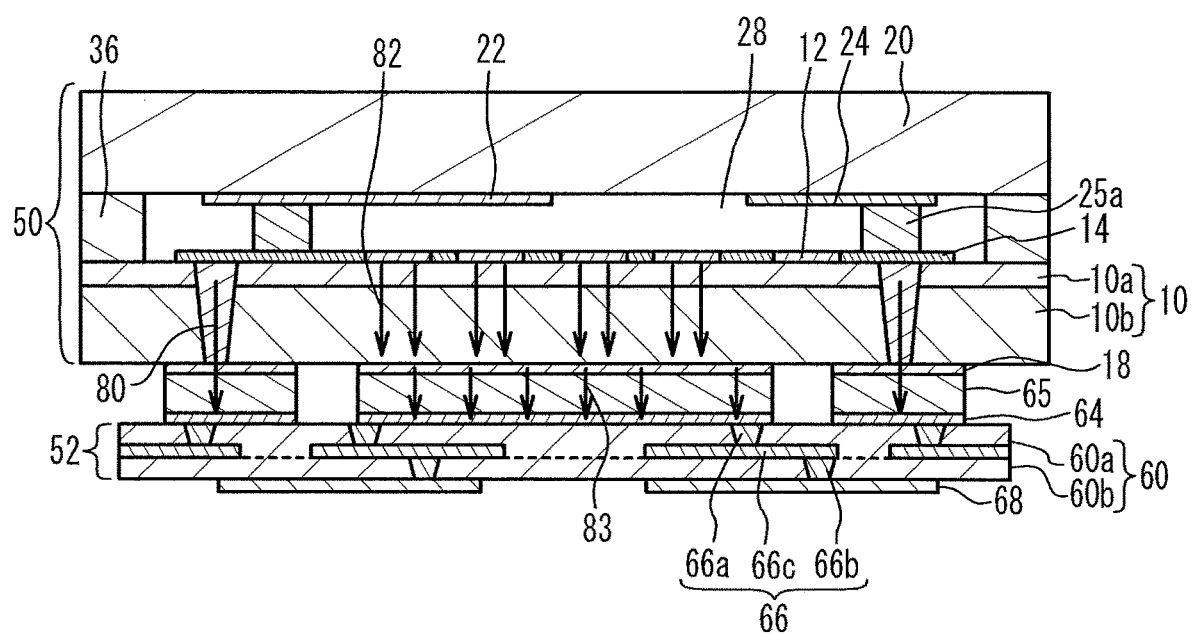
FIG. 12 is a cross-sectional view of an acoustic wave device in accordance with a first variation of the third embodiment mounted on a module substrate.

FIG. 12 is a cross-sectional view of an acoustic wave device in accordance with a first variation of the third embodiment mounted on a module substrate. As illustrated in FIG. 12, the substrate 20 is bonded on the upper surface of the substrate 10 via a ring-shaped metal layer 36 located in the periphery of the lower surface. The ring-shaped metal layer 36 seals the acoustic wave resonators 12 and 22 in the air gap 28. The ring-shaped metal layer 36 is made of the same material as, for example, a bump 25a, and is a copper layer or a gold layer. Other structures are the same as those of the third embodiment, and the description thereof is thus omitted.

In the third embodiment and the first variation thereof, the substrate 10 includes the piezoelectric substrate 10a having the upper surface of the substrate 10, and the support substrate 10b having the lower surface of the substrate 10. The support substrate 10b is, for example, a sapphire substrate, a spinel substrate, an alumina substrate, a crystal substrate, or a silicon substrate, while the piezoelectric substrate 10a is, for example, a lithium tantalate substrate or a lithium niobate substrate. The thermal conductivity of the support substrate 10b is greater than the thermal conductivity of the piezoelectric substrate 10a. This configuration makes the thermal resistance of the heat dissipating path 82 small, and further enhances the heat dissipation performance.

The piezoelectric substrate 10a and the support substrate 10b are preferably in contact with each other (i.e., are directly bonded with each other). This structure enhances the heat dissipation performance of the heat dissipating path 83. The piezoelectric substrate 10a and the support substrate 10b may be indirectly bonded with each other through an adhesive agent or the like. To enhance the heat dissipation performance, the support substrate 10b is preferably thicker than the piezoelectric substrate 10a.

Fourth Embodiment

Figure 13:
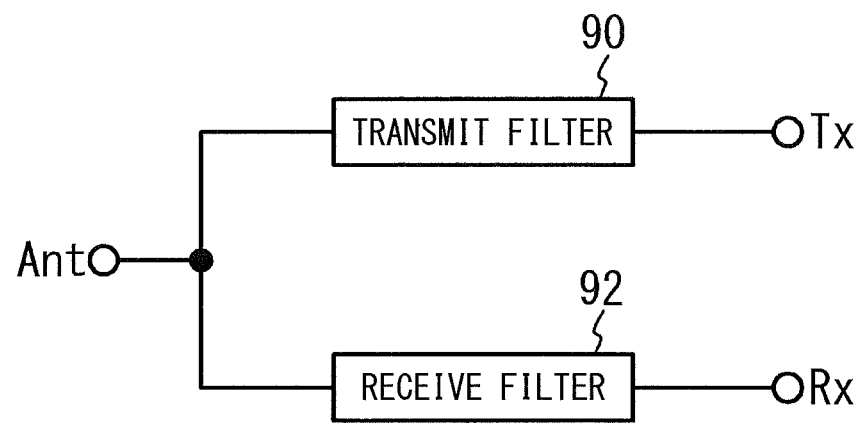
FIG. 13 is a circuit diagram of a duplexer in accordance with a fourth embodiment.

FIG. 13 is a circuit diagram of a duplexer in accordance with a fourth embodiment. As illustrated in FIG. 13, a transmit filter 90 is connected between a common terminal Ant and a transmit terminal Tx. A receive filter 92 is connected between the common terminal Ant and a receive terminal Rx. The passband of the transmit filter 90 does not overlap with the passband of the receive filter 92. The transmit filter 90 outputs signals in the transmit band to the common terminal Ant among high-frequency signals input to the transmit terminal Tx, and suppresses signals with other frequencies. The receive filter 92 outputs signals in the receive band to the receive terminal Rx among high-frequency signals input to the common terminal Ant, and suppresses signals with other frequencies.

At least one filter (a first filter) of the transmit filter 90 and the receive filter 92 includes the series resonators S1 through S5 and the parallel resonators P1 through P3 in accordance with the first through third embodiments and the variations thereof. This configuration enhances the heat dissipation performance of the filter. The transmit filter 90 generates more heat than the receive filter 92. Thus, the transmit filter 90 is preferably located on the upper surface of the substrate 10.

In the third embodiment and the first variation thereof, the substrate 20 (a second substrate) is mounted on the substrate 10 across the air gap 28. The lower surface (a third surface) of the substrate 20 faces the upper surface of the substrate 10 across the air gap 28. In this structure, the other filter (a second filter) of the transmit filter 90 and the receive filter 92 is located on the lower surface of the substrate 20. This structure reduces the size of the duplexer of the fourth embodiment.

The fourth embodiment has described a duplexer as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a first substrate;
a first terminal located on a first surface of the first substrate;
a second terminal located on the first surface of the first substrate;
a third terminal located on the first surface of the first substrate, the third terminal being a ground terminal;
series resonators located on a second surface of the first substrate opposite from the first surface and electrically connected in series with a path between the first terminal and the second terminal;
a parallel resonator located on the second surface of the first substrate, a first end of the parallel resonator being electrically connected to the path, a second end of the parallel resonator being electrically connected to the third terminal; and
a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected,
wherein the fourth terminal does not overlap with at least one resonator of a second series resonator of the series resonators and the parallel resonator in the thickness direction of the first substrate, the second series resonator having a first end to which another series resonator is electrically connected and a second end to which no series resonator is electrically connected.

2. The acoustic wave device according to claim 1, wherein the fourth terminal is electrically connected to none of the first terminal, the second terminal, and the third terminal in the first substrate.

3. The acoustic wave device according to claim 1, wherein the fourth terminal is electrically connected to the third terminal on the second surface.

4. The acoustic wave device according to claim 1, wherein the fourth terminal overlaps with, in the thickness direction of the first substrate, at least one first series resonator of the one or more first series resonators so that at least one of the at least one first series resonator is located within the fourth terminal.

5. The acoustic wave device according to claim 1, wherein the fourth terminal overlaps with at least two of the one or more first series resonators in the thickness direction of the first substrate.

6. The acoustic wave device according to claim 1, wherein the first substrate includes a piezoelectric substrate having the second surface, and a support substrate having the first surface and having a thermal conductivity greater than a thermal conductivity of the piezoelectric substrate.

7. The acoustic wave device according to claim 6, wherein the piezoelectric substrate is in contact with the support substrate.

8. A multiplexer comprising:
an acoustic wave device including:
a first substrate,
a first terminal located on a first surface of the first substrate,
a second terminal located on the first surface of the first substrate,
a third terminal located on the first surface of the first substrate, the third terminal being a ground terminal,
series resonators located on a second surface of the first substrate opposite from the first surface and electrically connected in series with a path between the first terminal and the second terminal,
a parallel resonator located on the second surface of the first substrate, a first end of the parallel resonator being electrically connected to the path, a second end of the parallel resonator being electrically connected to the third terminal, and
a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected, wherein the series resonators and the parallel resonator form a first filter,
the multiplexer further comprising:
a second substrate mounted on the first substrate across an air gap; and
a second filter located on a third surface of the second substrate, the third surface facing the second surface across the air gap.

9. An acoustic wave device comprising:
a first substrate;
a first terminal located on a first surface of the first substrate;
a second terminal located on the first surface of the first substrate;
a third terminal located on the first surface of the first substrate, the third terminal being a ground terminal;

series resonators located on a second surface of the first substrate opposite from the first surface and electrically connected in series with a path between the first terminal and the second terminal;
a parallel resonator located on the second surface of the first substrate, a first end of the parallel resonator being electrically connected to the path, a second end of the parallel resonator being electrically connected to the third terminal;
a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected; and
a through electrode that is adjacent to at least one first series resonator of the one or more first series resonators, is electrically connected to none of the series resonators and the parallel resonator on the second surface, penetrates through the first substrate, and is connected to the fourth terminal.

10. An acoustic wave device comprising:
a first substrate;
a first terminal located on a first surface of the first substrate:
a second terminal located on the first surface of the first substrate;
a third terminal located on the first surface of the first substrate, the third terminal being a ground terminal;
series resonators located on a second surface of the first substrate opposite from the first surface and electrically connected in series with a path between the first terminal and the second terminal;
a parallel resonator located on the second surface of the first substrate, a first end of the parallel resonator being electrically connected to the path, a second end of the parallel resonator being electrically connected to the third terminal;
a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected; and
a metal column that overlaps with the one or more first series resonators in the thickness direction of the first substrate, is located from the first surface to a middle part of the first substrate, and is connected to the fourth terminal.

11. A module comprising:
an acoustic wave device including:
a first substrate,
a first terminal located on a first surface of the first substrate,
a second terminal located on the first surface of the first substrate,
a third terminal located on the first surface of the first substrate, the third terminal being a ground terminal,
series resonators located on a second surface of the first substrate opposite from the first surface and electrically connected in series with a path between the first terminal and the second terminal,
a parallel resonator located on the second surface of the first substrate, a first end of the parallel resonator being electrically connected to the path, a second end of the parallel resonator being electrically connected to the third terminal, and
a fourth terminal located on the first surface of the first substrate, at least a part of the fourth terminal overlapping with, in a thickness direction of the first substrate, at least a part of at least one of one or more first series resonators of the series resonators, each of the one or more first series resonators having both ends to which other series resonators are electrically connected; and
a module substrate that has a third surface facing the first surface and a fourth surface opposite from the third surface, and includes a fifth terminal located on the third surface and bonded with the fourth terminal, a sixth terminal located on the fourth surface for connecting to an external device, and a metal pattern connecting the fifth terminal and the sixth terminal.

* * * * *